United States Patent [19]

Sekibata et al.

[11] Patent Number: 4,765,528
[45] Date of Patent: Aug. 23, 1988

[54] PLATING PROCESS FOR AN ELECTRONIC PART

[75] Inventors: Masao Sekibata, Kunitachi; Toshihiko Ohta, Hadano; Osamu Miyazawa, Yokosuka, all of Japan

[73] Assignee: Hitachi, Ltd., Tokyo, Japan

[21] Appl. No.: 895,842

[22] Filed: Aug. 12, 1986

[30] Foreign Application Priority Data

Sep. 6, 1985 [JP] Japan .................................. 60-195856

[51] Int. Cl.$^4$ .............................................. B23K 31/02
[52] U.S. Cl. ...................................... 228/123; 204/15; 204/37.1
[58] Field of Search ................. 204/37.1, 15; 228/179, 228/180.2, 123

[56] References Cited

U.S. PATENT DOCUMENTS 4,411,965  10/1983  Rosegren et al. ................... 428/672

FOREIGN PATENT DOCUMENTS 89044    9/1983  European Pat. Off. .
127857  12/1984  European Pat. Off. .
143607   6/1985  European Pat. Off. .
2027945  5/1977  Fed. Rep. of Germany .

OTHER PUBLICATIONS

Patent Abstracts of Japan, unexamined applications, C Field, vol. 8, No. 46, 65 C 212, Feb. 29, 1984.
Patent Abstracts of Japan, unexamined applications, C Field, vol. 4, No. 69, 66 C 11, May 22, 1980.
Clifford A. Hampel, "The Encyclopedia of Electrochemistry", pp. 708-711, (1964).

Primary Examiner—G. L. Kaplan
Attorney, Agent, or Firm—Antonelli, Terry & Wands

[57] ABSTRACT

Before Au-plating onto the metallic surface of an electronic part, Ni-plating and then Co-plating are applied to form a primer coating for Au-plating. But in the steps of Ni and Co-platings, hydrogen gas produced during the plating is occluded into a plating layer. On the other hand, when a pellet connected onto an Au-plated metal, an Au-Si alloy is formed, but hydrogen gas in the plating layer remains as voids in the Au-Si alloy during a subsequent heating step of the electronic part, resulting in a serious defect. This invention of a plating method is characterized by annealing after Au-plating of an electronic part to eliminate the residual gas.

3 Claims, 1 Drawing Sheet

PLATING PROCESS FOR AN ELECTRONIC PART

BACKGROUND OF THE INVENTION

The invention relates to an electronic part having gold-plating on its metallic surface.

Gold is widely used in various electronic parts because of its excellent heat resistance, corrosion resistance, solderability, wire bonding property and pellet-bonding property owing to formation of Au-Si eutectic alloy.

Regarding gold-plating, the manufacturing course of an electronic part provided with pads of metallized layers on a ceramic substrate board is described below. After metallized pads have been formed on a ceramic substrate board, Ni-plating is applied to the pad, and leads are connected to the pad which require lead connecting by soldering. Then coatings by Ni-plating, Co-plating and further Au-plating are applied onto a conductor by electric plating in that order. Next, a semiconductor pellet is subjected to die-bonding on the pad. After the pellet is connected to another pad by a wire bonding process, the semiconductor is sealed by glass having a low melting point, or the like. Ni-Co plating as a primer coating for Au-plating herein, is applied to prevent problems which are caused by peeling of Au-plating during seal heating after wire bonding. But in the step of further Co-plating onto a Ni-plated film, hydrogen gas produced during the plating is occluded into plated layers, and thus remains as voids in a Au-Si alloy formed on a pellet upon pellet-bonding by heating at the step of pellet-bonding and the sealing by a low melting point glass, and this results in a serious defect regarding the reliability of the pellet-bonding. Moreover, the Ni-Co-Au plated layer consists of three layers, and consequently strains in the plates between the layers is so large that the problem of peeling of the plated layers may arise when a lead is bent.

In addition, the techniques concerning this field are described in Nos. 34692/80, 4955/83 and 155950/84 of Japanese laid open patents.

SUMMARY OF THE INVENTION

The object of this invention is to provide a plating process for an electronic part which has no voids in Au-Si eutectic crystals formed upon pellet-bonding when Au-plating is applied as the primary coating on Ni-Co platings for an electronic part.

The characteristic of the invention is the plating process of an electronic part that is annealed after Ni-plating, Co-plating and a further Au-plating have been applied onto its metallic surface in that order.

DESCRIPTION OF THE PREFERRED EMBODIMENTS

Figure 1:
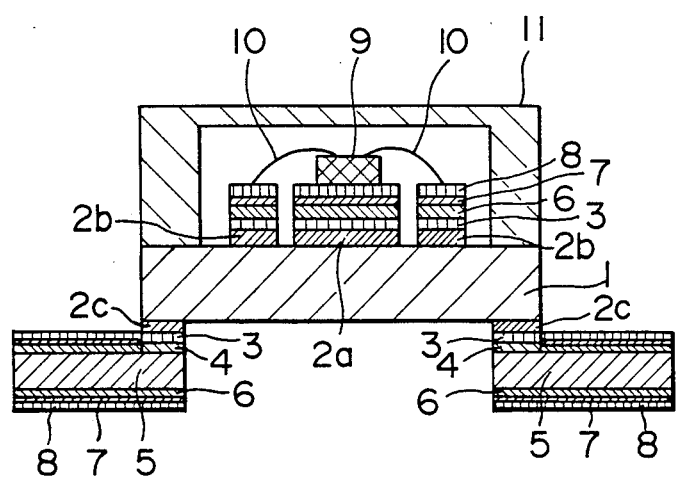
FIG. 1 is the sectional view of an electronic part.

An example of this invention is explained in FIG. 1.

FIG. 1 is the sectional view of a finished electronic part in which 1, 9, 10 and 5 are a ceramic board, a semiconductor pellet, a wire treated with wire bonding and a lead extended from this electronic part, respectively. 2a, 2b and 2c are conductor pads formed on ceramic board 1, i.e., a pad connected with pellet 9, a pad connected by a wire bonding and a pad connected with lead 5, respectively. 11 is a sealing cap. The method of the working example is explained below in due order.

EXAMPLE

First, pads constituted of a metal having a high melting point such as W or Mo, etc. are formed on the ceramic substrate board 1 by a screen printing process, etc. When the pad is sintered with the ceramic substrate board 1, the pads 2a, 2b and 2c are formed by consolidatedly mutual sintering of ceramic and the metal. Then Ni is plated on pads 2a, 2b and 2c to form Ni-plated film 3.

Next, pad 2c is soldered with lead 5 by a soldering material 4 such as eutectic silver. Then Ni-plated film 6, Co-plated film 7, and further an Au-plated film 8 thereonto are formed in 2-5 $\mu$m, 0.5-2 $\mu$m, and 1-3 $\mu$m of thickness, respectively, by electric plating. Then the electronic part is annealed by heating up to 450° C., for 10 minutes under $N_2$ atmosphere.

As usual afterwards, pellet 9 is die-bonded to pad 2a, and pellet 9 is connected to pad 2b through wire 10 by wire bonding, and a sealing cap 11 is fused to the ceramic board 1 with a low melting point glass to seal pellet 9, and finally lead 5 is coated with solder.

When the lead was bent to make an angle of 90 degrees after annealing as described above, no peeling appeared on the plating. And the observation by X-ray did not indicate the generation of voids in the pellet-bonded part. The reliability of an electronic part could be thus improved significantly. In addition, the results of soldering property, etc. are normal and excellent.

This invention can give a reliable plating process for an electronic part, which yields no voids in Au-Si eutectic crystal because it can eliminate residual gases in a plating by an annealing process after plating.

We claim:

1. A manufacturing process of an electronic part, comprising the steps of:
    successively forming, in order, a Ni-plated film, a Co-plated film and an Au-plated film by electroplating method onto metallized pads formed on a ceramic substrate board;
    heating the plated substrate board, after the electroplating, so as to remove hydrogen gas produced with said films; and
    then die-bonding a semiconductor pellet onto one of said metallized pads after the electroplating so as to form an Au-Si alloy, free from voids due to hydrogen gas, on said pellet.

2. A manufacturing process according to claim 1, wherein said heating is performed at a temperature up to 450° C., under an $N_2$ atmosphere.

3. A manufacturing process according to claim 2, wherein said metallized pads are composed of W or Mo.

* * * * *